United States Patent [19]
Stowers et al.

[11] Patent Number: 5,420,519
[45] Date of Patent: * May 30, 1995

[54] DOUBLE-HEADED SPRING CONTACT PROBE ASSEMBLY

[75] Inventors: Jeffery P. Stowers; Henri T. Burgers; Paul D. Blackard, all of Waynesboro, Va.

[73] Assignee: Virginia Panel Corporation, Waynesboro, Va.

[*] Notice: The portion of the term of this patent subsequent to Jul. 13, 2010 has been disclaimed.

[21] Appl. No.: 49,395

[22] Filed: Apr. 21, 1993

Related U.S. Application Data

[63] Continuation-in-part of Ser. No. 848,894, Mar. 10, 1992, Pat. No. 5,227,718.

[51] Int. Cl.⁶ .................. G01R 15/12; H01R 4/40
[52] U.S. Cl. .................. 324/754; 324/72.5; 439/482
[58] Field of Search ............ 324/72.5, 158 P, 158 F, 324/754, 750, 149; 439/482, 825

[56] References Cited

U.S. PATENT DOCUMENTS

| | | | |
|---|---|---|---|
| 3,157,455 | 11/1964 | Takano | 439/841 |
| 3,255,430 | 6/1966 | Phillips | 439/825 |
| 4,528,500 | 7/1985 | Lightbody et al. | 324/158 P |
| 4,560,926 | 12/1985 | Cornu et al. | 324/158 P |
| 4,636,026 | 1/1987 | Cooney et al. | 439/819 |
| 4,701,702 | 10/1987 | Kruger | 324/158 P |
| 4,721,903 | 1/1988 | Harsch et al. | 324/158 P |
| 4,749,943 | 6/1988 | Black | 329/158 P |
| 4,787,861 | 11/1988 | Kruger et al. | 324/158 P |
| 4,935,696 | 6/1990 | DiPerna | 324/158 P |
| 4,983,909 | 1/1991 | Swart et al. | 324/158 P |
| 5,014,004 | 5/1991 | Kreibich et al. | 324/158 P |
| 5,032,787 | 7/1991 | Johnston et al. | 324/158 P |
| 5,034,749 | 7/1991 | Jungblurt et al. | 324/158 P |

FOREIGN PATENT DOCUMENTS

| | | | |
|---|---|---|---|
| 0127466 | 7/1985 | Japan | 324/158 P |
| 0098566 | 4/1988 | Japan | 324/158 P |

OTHER PUBLICATIONS

"Spring Plunger Contact", by Buyck et al., IBM Tech Disc. Bull., vol. 15, No. 1, Jun. 1972, p. 58.

*Primary Examiner*—Vinh Nguyen
*Attorney, Agent, or Firm*—Lowe, Price, LeBlanc & Becker

[57] ABSTRACT

A double-headed spring contact probe for loaded board testing including a barrel having a hollow interior and opposite plungers which slide axially in the barrel is described. The plungers have outer portions which extend through the opposite open ends of the barrel, each terminating in a contact tip outside the barrel for contacting a test point on a circuit board. One of the plungers has a hollow receptacle extending into the barrel with a rectangular or notched keyway opening into the receptacle. The keyway is disposed at an angle of about 6° to the longitudinal axis thereof. The other plunger has a twisted guide member extending through the barrel into the keyway of the other plunger whereby axial translation of the plungers relative to each other causes a rotation thereof and the keyway rides in the groove for electrical contact as translational movement occurs. A leafspring is further provided on the hollow receptacle adjacent the notched keyway for contacting the twisted guide member of the other plunger to minimize electrical resistance during axial translation. In addition, the plunger may have an open end extending from the barrel with inwardly directed fingers for engaging a contact tip for retaining the same therein.

9 Claims, 9 Drawing Sheets

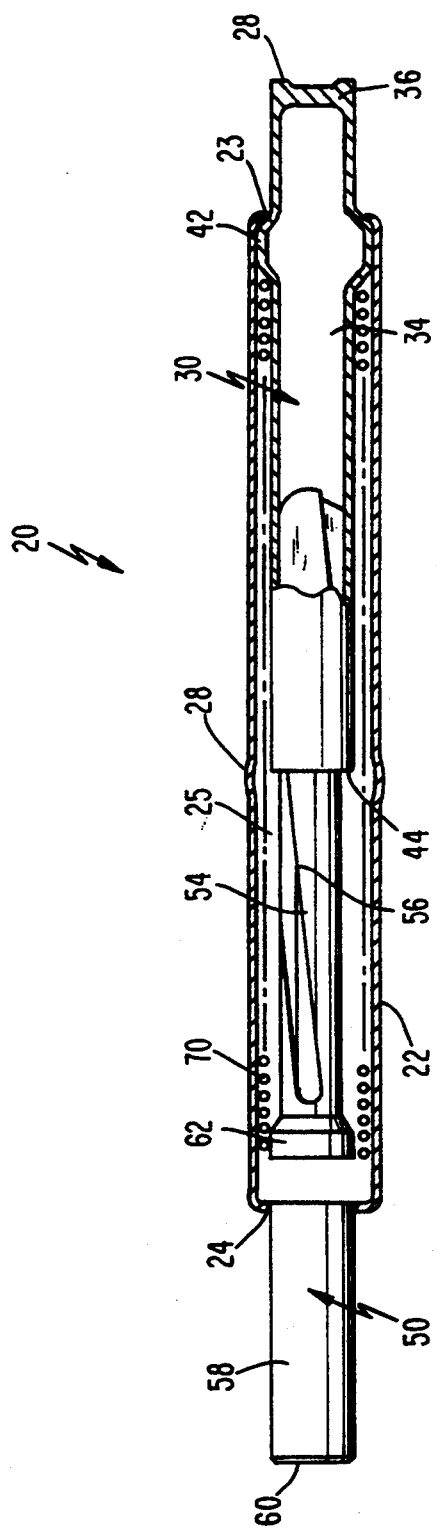
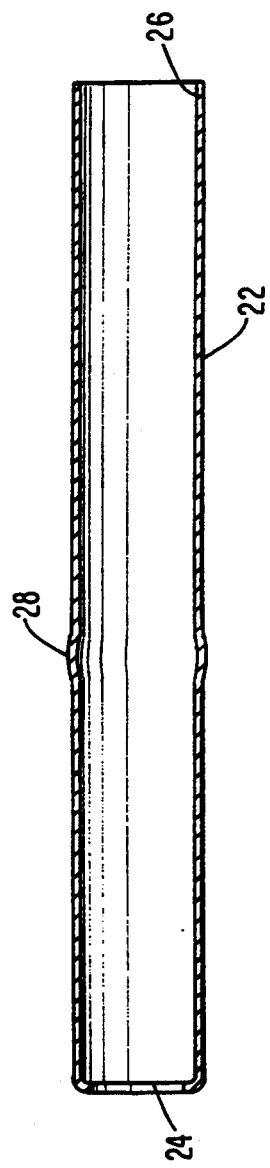
Figure 1
Figure 2

DOUBLE-HEADED SPRING CONTACT PROBE ASSEMBLY

CROSS REFERENCE TO RELATED APPLICATIONS

This application is a continuation-in-part of patent application Ser. No. 07/848,894, filed Mar. 10, 1992, now U.S. Pat. No. 5,227,718.

TECHNICAL FIELD

The invention relates to electrical probes and, more particularly, to miniature spring-loaded probes for providing electrical contact between electrical components mounted on parallel circuit boards.

BACKGROUND ART

Testing, diagnosis, maintenance and calibration of electronic devices often require supplying test signals to, and receiving signals from, components of a Device Under Test (DUT) or Unit Under Test (UUT). When an electronic device is fabricated on one or more circuit boards, electronic components mounted on the circuit boards may not be accessible for testing using existing circuit board mounted connectors. Therefore, connections to components to be tested are made using external electrical probes applied to the exposed leads of the components and/or to a printed circuit board wiring layer.

Automatic testing of electrical circuits requires simultaneous connection to many circuit test points. The automatic testing equipment simultaneously supplies signals to, and receives signals from, combinations of test points. A conventional test fixture used to electrically probe a circuit card of a DUT includes a "bed of nails" having a platform for supporting the circuit card and an array of single headed spring probes. Each spring probe includes a probe head which makes positive electrical contact with an overlying portion of the circuit board being tested. An opposite end of each probe is connected to test equipment through single point wiring.

A conventional single headed electrical test probe is described by Johnston et al., U.S. Pat. No. 5,032,787 issued Jul. 16, 1991, incorporated herein by reference. The Patent describes a test probe assembly including a barrel having a hollow interior and a plunger which slides axially in the barrel. The plunger has an outer portion extending through an open end of the barrel, terminating in a contact tip outside the barrel for contact with a test point and a hollow, elongated receptacle extending through the barrel. The receptacle has a square or rectangular pilot hole so that an elongated fixed guide member in the barrel extends through the pilot hole. The guide member extends through the interior of the barrel away from the pilot hole and has an outer surface which engages the pilot hole. A spring inside the barrel extends along the guide member and is biased against the internal end of the receptacle inside the barrel.

Axial travel of the Johnston et al. plunger into the barrel is against the spring bias. The outer surface of the guide member engages the correspondingly shaped pilot hole and controls rotational motion of the plunger as it travels along the guide member against the bias of the spring. Thus, the Johnston et al. probe is useful to connect a test lead to a component or conductive layer on a circuit board.

In testing equipment and other electronic equipment which must be adapted to varied uses, it is often necessary to reconfigure signal connections and condition signals to interface the equipment to a particular DUT. This can be accomplished by dedicated wiring, patch panels, and/or using appropriate signal routing/conditioning interface equipment in the form of a personality board. A personality board is connected between a testing device and a DUT to properly route and condition signals between the two devices. Thus, a testing device is electrically adapted to a particular DUT by using an appropriate personality board. Substitution of personality boards allows a single testing device to be used with a plurality of DUTs.

The testing device is connected to a personality board which, in turn, is connected to a test fixture holding the DUT using conventional electrical connectors and cabling. However, the additional wiring used to connect the personality board can impair signal connectivity and degrade the transmitted signals. The added connectors and cables also increase device cost and require additional mounting space on each circuit board and between circuit boards. Further, the device connectors are subject to misalignment and introduce maintenance and reliability problems. Multiple connectors and cabling also complicate the substitution of personality boards.

Accordingly, a need exists for a connector system providing easy installation and replacement of circuit board mounted devices.

A need further exists for a low resistance electrical connector for interfacing circuits and wiring mounted on opposing circuit boards.

A still further need exists for a reconfigurable connector system for interfacing various nodes of an electronic device to a corresponding point of a second electronic device without intervening connectors.

DISCLOSURE OF THE INVENTION

An object of the invention is to provide a connector and connector system permitting ready installation and replacement of circuit boards requiring frequent changing.

Another object of the invention is to provide a connector and connector system for directly connecting electronic circuitry on opposing parallel circuit cards.

Another object of the invention is to provide a low loss signal path between electronic devices.

A further object of the invention is to provide a universal array of connectors for electrically interfacing a variety of electronic devices.

According to one aspect of the invention, a double-headed spring contact probe for loaded board testing includes a barrel having a hollow interior and opposite plungers which slide axially and are free to rotate, in the barrel. The plungers have outer portions which extend through opposite open ends of the barrel, each terminating in a contact tip outside the barrel for contacting a test point on a circuit board. One of the plungers has a hollow receptacle extending into the barrel with a rectangular or notched keyway opening into the receptacle. The other plunger has a twisted guide member extending through the barrel into the keyway of the other plunger whereby axial translation of the plungers relative to each other causes relative rotation thereof. A spring engages opposite shoulder or collar portions of the plungers to bias the plungers outwardly against opposite ends of the barrel. Necked portions of the barrel limit travel of the plungers out from the barrel.

Rotation of the probe ends improve the resultant contact of the probe with the circuit board under test or a companion personality board as the rotating ends sweep oxide off of the contact area. The invention also exhibits improved electrical conductivity between plungers by providing a straight line current path between plungers, conductivity between the plungers provided by engagement of the guide member at the keyway opening. The double-headed construction further accommodates direct Printed Circuit (PC) board to PC board electrical connection.

According to another aspect of the invention, an electrical probe includes a housing having first and second opposite open ends. A first elongate plunger is partially positioned within the housing. A first portion of the first plunger extends out from the housing through the first opening end and terminates in a first electrical contact probe. A second portion of the first elongate plunger is rod-like, and is lengthwise contiguous with the first portion. The second portion is positioned within the housing and includes a bearing surface for transmitting a torque.

A second elongate plunger is likewise partially positioned within the housing. A first portion extends out from the housing through the second open end of the housing and terminates in a second electrical contact probe head. The second portion of the second elongate plunger is tubular, lengthwise contiguous with the first portion, and is positioned within the housing. The second rod-like portion of the first elongate plunger is centrally positioned within the hollow second portion of the second elongate plunger. An aperture within the second portion of the second elongate plunger engages the bearing surface of the first elongate plunger.

A compression spring is positioned within the housing and is positioned to engage the first and second plungers, biasing the plungers outward from the housing. The ends of the housing have restricted apertures for limiting axial travel of the first and second elongate plungers out from the housing.

According to a feature of the invention, one or more spiral channels are formed along a length of the second portion of the first elongate plunger, the bearing surface being formed by one or more walls of one or more channels. The aperture in the second elongate member may comprise a keyway and the second portion of the first elongate plunger may comprise a cylindrical member having a helical channel forming the bearing surface for engaging the keyway. The helical channel may subtend a radial angle of between 90 and 150 degrees over the length of the second portion of the first elongate plunger, an angle of 120 degrees plus or minus five degrees being preferred.

According to still another aspect of the invention, an electrical interface board includes a frame made of an insulating substrate and an array of probe assemblies extending axially through the frame. Each of the probe assemblies includes a housing having first and second opposite open ends, a spring and first and second plungers. The first plunger is partially positioned within the housing and has a first portion extending out from the housing through the first opening end and terminating in a first electrical contact probe. A rod-like second portion of the first plunger is lengthwise contiguous with the first portion and is positioned within the housing. The second portion has a bearing surface for transmitting a torque.

A second plunger is also partially positioned within the housing and includes a first portion extending out from the housing through the second open end, terminating in a second electrical contact probe head. A tubular second portion, lengthwise contiguous with the first portion, is positioned within the housing so that the second portion of the first plunger is positioned within the hollow cavity of the second portion of the second plunger. The second portion of the second plunger has an aperture at a terminal end for engaging the bearing surface of the first elongate plunger. The compression spring is positioned within the housing and engages the first and second elongate plungers, axially biasing the plungers outward from the housing.

In a further improvement or additional embodiment of this invention, the plunger barrel portion is designed for increased electrical contact with the plunger and its spiral groove. Specifically, in this embodiment, the keyway for engaging the plunger channel is disposed at about a 6° angle to the axis thereof so that the keyway will ride in the plunger channel. In addition, a leafspring is disposed along the keyway on the barrel to contact the plunger as it translates along the length of the barrel. Finally, the plunger barrel portion which normally receives a solid probe may have mutually spaced leaves inwardly crimped from the end thereof to engage the probe and retain the same in the barrel plunger.

The foregoing and other objects, features, aspects and advantages of the present invention will become more apparent from the following detailed description of the present invention when taken in conjunction with the accompanying drawings.

BRIEF DESCRIPTION OF DRAWINGS

FIG. 1 is a partial cross sectional view of a double-headed twist probe according to the invention.

FIG. 2 is a sectional view of a probe housing prior to insertion of plungers and crimping of the open insertion end.

BEST MODE FOR CARRYING OUT THE INVENTION

Figure 3:
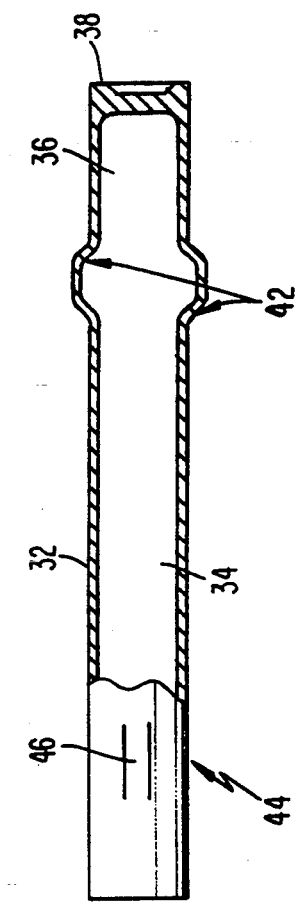
FIG. 3 is a partial sectional view of a plunger barrel portion.

Referring to FIG. 1, a miniature double-headed twist probe 20 includes a hollow tubular housing 22 having open ends 23 and 24. A tubular plunger 30 is slidably positioned within central cavity 25 of housing 22, extending outward through aperture 23 and terminating in contact tip 38. An internal barrel portion 34 of plunger 30 is coaxial with housing 22, extending approximately to the midpoint of the housing. Opposing rod-like plunger 50 is slidably positioned within an opposite portion of cavity 25, extending out from housing 22 through aperture 24 and terminating in contact tip 60. An internal twisted rod portion 54 of plunger 50 is shaped like a drill bit or slotted helix, extending through a matching aperture or keyway 44 of barrel portion 34. Both plungers 30 and 50 are free to rotate and longitudinally translate within housing 22. External portions of plungers 30 and 50 are made of a conductive substance such as heat treated beryllium copper (BeCu) or hardened steel plated with gold over nickel. Housing 22 is preferably made of a material such as deep drawn gold plated brass or nickel silver.

Plunger 30 includes lengthwise contiguous internal hollow tubular or barrel portion 34 and external probe portion 36 which axially extends out through an aperture in an end of housing 22. A shoulder portion 42 limits travel of plunger 30, maintaining the probe within housing 22 by engaging a restricted portion of the aperture formed by crimping or rolling. An inner face of shoulder portion 42 serves as a seat for spring 70 which biases plunger 30 outward from housing 22.

Plunger 50 axially extends through an opposite aperture in housing 22 and includes an internal twist rod portion 54 within the housing and an external probe portion 58 having a terminal contact tip 60. Internal twist rod 54 is helically formed and includes a twisted bearing surface 56. Internal twist rod 54 passes through an aperture forming a keyway 44 in an internal terminal end of barrel 34. Keyway 44 engages twist rod 54, including bearing surfaces 56 thereof so that axial travel of the plungers results in relative rotation thereof.

Spring 70 is positioned within cavity 25 of housing 22, coaxially surrounding barrel 34 and twisted rod 54 of the plungers. Spring 70 is made of a spring material such as stainless steel, music wire or beryllium copper and is positioned within housing 22. Opposite ends of spring 70 are seated on and engage shoulder portion 42 and collar portion 62 of plungers 30 and 50, respectively, thereby biasing the plungers outward from the housing. Inward travel of plungers 30 and 50 is against an outward bias provided by spring 70.

Housing 22 prior to assembly of the twist probe is shown in FIG. 2 of the drawings. The housing has a substantially tubular body with an aperture 24 formed at one end while an opposite end 26 remains open for insertion of the remaining probe components. A bulge in the housing forms press ring 28 for retaining the twist probe housing in a support member. After plunger 30, spring 70 and probe 50 are inserted into housing 22, open end 26 is rolled to form a lip, securing the components within the housing.

Figure 4:
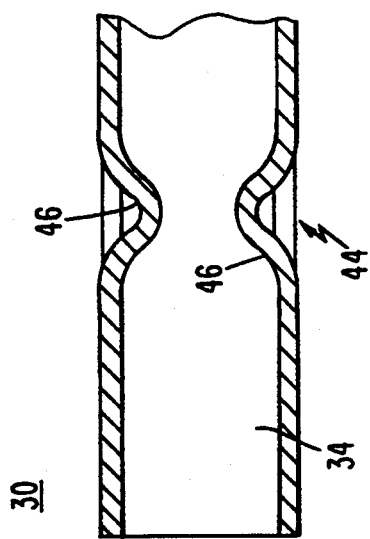
FIG. 4 is a partial sectional view of a barrel keyway.
Figure 5:
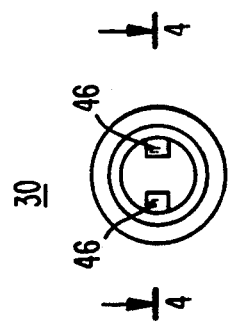
FIG. 5 is a partial cross-sectional view of a plunger barrel.

Plunger 30 is shown in greater detail in FIGS. 3–5 of the drawings. Therein, plunger 30 is made of a tubular material such as 360 brass plated with gold over nickel. Plunger 30 has an open internal barrel portion 34 and a closed external probe portion 36 terminating in contact tip 38. Shoulder portion 42 both limits axial travel of the probe within housing 22, and provides a seating surface for engaging spring 70, biasing plunger 30 outward from housing 22. Keyway 44 includes crimped portions 46 forming tabs extending radially into the cavity 34 of internal barrel 32. These tabs are configured to engage bearing surface 56 of probe 50.

Figure 6:
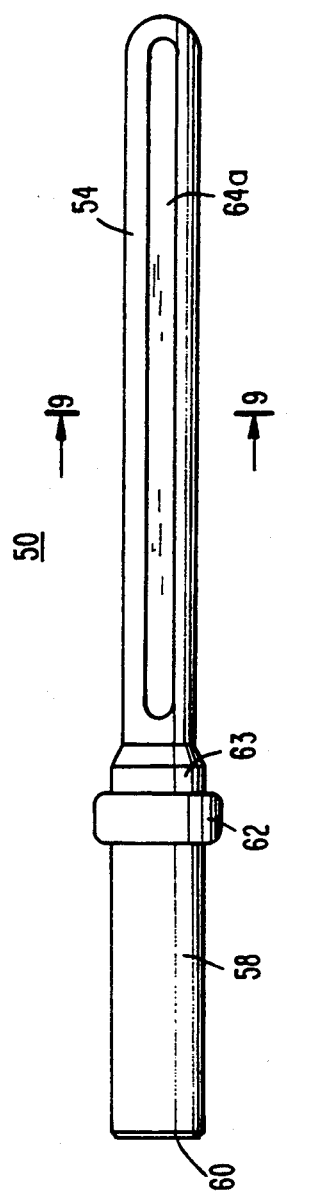
FIG. 6 is a side view of a plunger prior to twisting.
Figure 7:
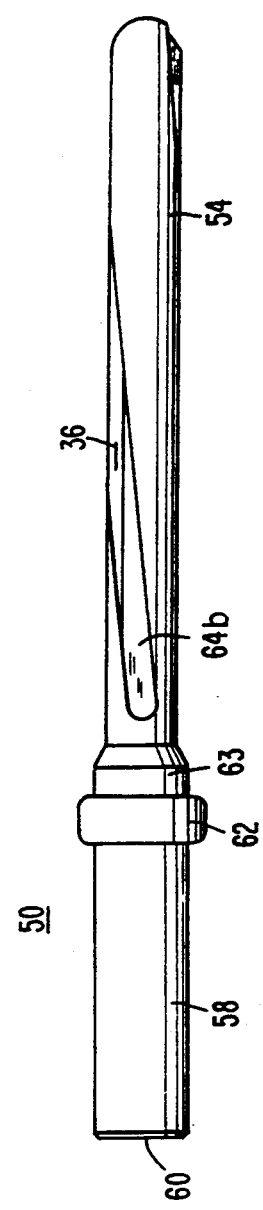
FIG. 7 is a side view of a plunger after twisting to form a spiral channel.
Figure 8:
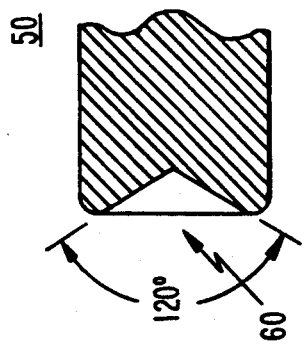
FIG. 8 is a partial sectional view of a terminal end of a plunger forming an electrical contact probe head.
Figure 9:
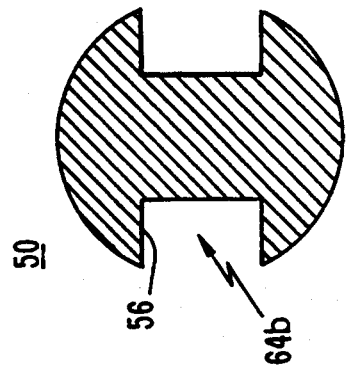
FIG. 9 is a cross-sectional view of a plunger showing channel detail.

Referring to FIGS. 6–9, plunger 50 includes an internal rod portion forming internal twist rod 54. Initially, as shown in FIG. 6, a straight channel 64a is formed in opposite sides of the surface of twist rod 54. The rod is then twisted 120 degrees as shown in FIG. 7 so that a spiral groove is formed by the twisted channel 64b. Channel 64b is configured to engage keyway 44 of plunger 30 whereby relative axial movement of the probes causes relative rotation of the probes. Collar portion 62 of plunger 50 limits axial travel of the probe and forms a seat for the opposite end of spring 70, biasing probe 50 outward of housing 22 against plunger 30. Shoulder portion 63 abuts collar portion 62 on the inner portion of plunger 50 and engages an inner surface of spring 70 to maintain coaxial alignment of the spring within housing 22.

Although the keyway and matching bearing surface of plungers 30 and 50 are shown as inward protruding tabs or "divots" engaging a channel, other geometric shapes can be used. For example, keyway 44 may comprise a rectangular aperture to engage a plunger having a corresponding mating rectangular cross-section. The tab/channel combination, however, has the advantage of increasing plunger-to-plunger contact surface area thereby minimizing electrical resistance through the probe.

Figure 15:
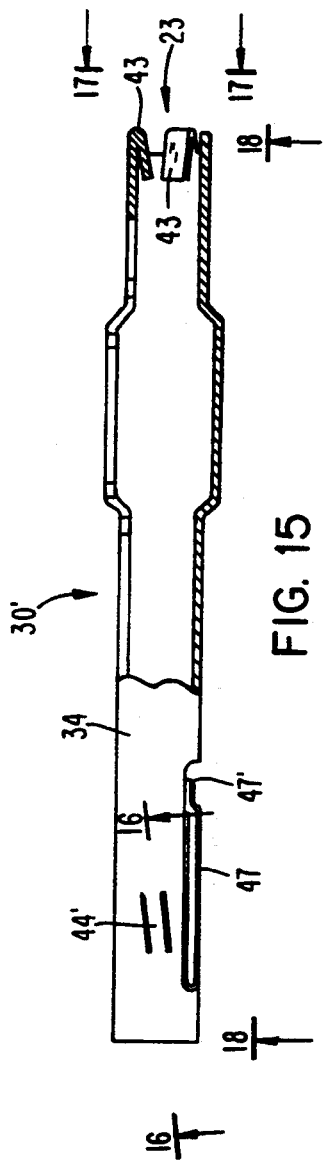
FIG. 15 is a partial sectional view similar to FIG. 3 illustrating an alternative embodiment of the plunger barrel portion.
Figure 16:
FIG. 16 is a view taken along lines 16—16 of FIG. 15.

A further embodiment of the plunger barrel shown in FIGS. 3–5 is provided in FIGS. 15–18. In that embodiment, the plunger barrel 30' mounts the inwardly protruding tab or "divot" 44'. However, it is disposed at an acute angle of about a 6° angle to the longitudinal axis of the plunger barrel 30' (or an obtuse angle if viewed in the opposite direction of 174°) to more precisely accommodate the spiral groove formed by the twisted channel 64b in twist rod 54. As will be obvious to those skilled in the art, by providing the keyway 44' at the angle shown, it will engage channel 64b for better electrical connection. As shown in FIG. 16, the keyway 44' is provided on opposite sides of the barrel portion 34 to engage both the grooves 64b in the twist rod 54. In this way, the key way 44' will engage the channels and continue to engage the channels during relative rotational movement of the plungers caused by relative movement thereof along the common longitudinal axis.

Figure 18:
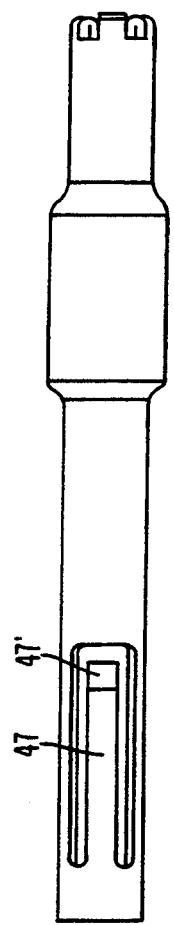
FIG. 18 is a view taken along lines 18—18 of FIG. 15.

In addition, with attention to FIGS. 15 and 18, the barrel portion 34 also provides a leafspring 47 having a bearing surface 47' for contacting the plunger twist rod 54 as it moves axially through the barrel 30'. As shown in FIG. 18, the leafspring 47 is stamped from the barrel portion and is integral therewith.

Figure 10:
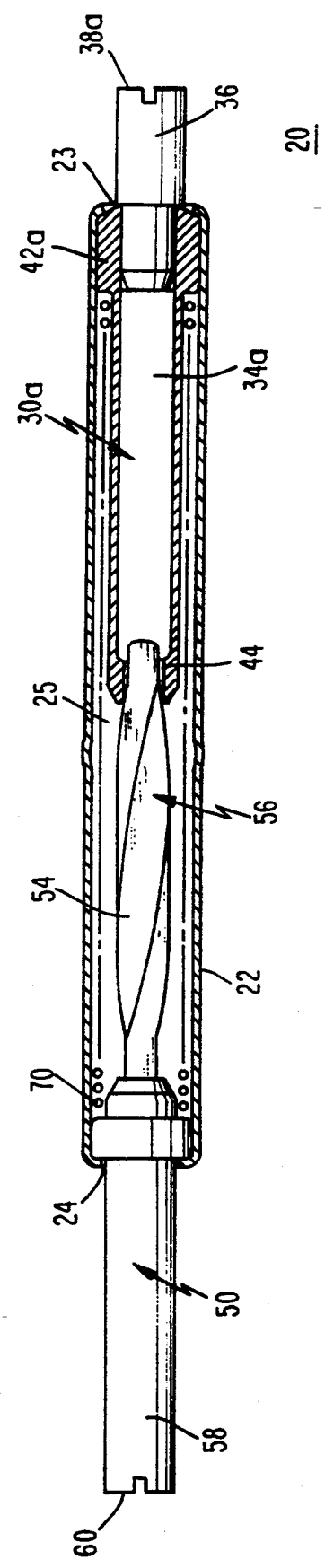
FIG. 10 is a partial sectional view of an alternate embodiment of a double-headed twist probe.

In another embodiment of the invention, spring 22 can be positioned within internal barrel 34 to bias plungers 30 and 50 axially outward from housing 22. An alternate construction of the double-headed twist probe is illustrated in FIG. 10. Housing 22 and plunger 50 are substantially the same as in the first embodiment of FIG. 1. However, plunger 30a is constructed of discrete portions including a barrel portion 34a having a distal end including collar portion 42a retaining a solid probe 36a. Although this embodiment requires more machining than is required by the first embodiment, the discrete solid probe 36a accommodates a greater variety of geometries for contact tip 38a.

Figure 17:
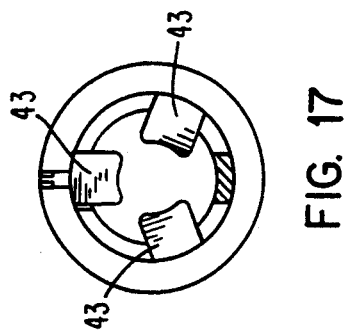
FIG. 17 is a view taken along lines 17—17 of FIG. 15.

As an alternative to collar portion 42a, as shown in FIGS. 15 and 17, leaves 43 may be provided around the circumference of the open distal end to facilitate retaining a solid probe. The leaves 43 are intended to engage a corresponding collar portion (not shown) of a probe 36 inserted thereinto.

Figure 11:
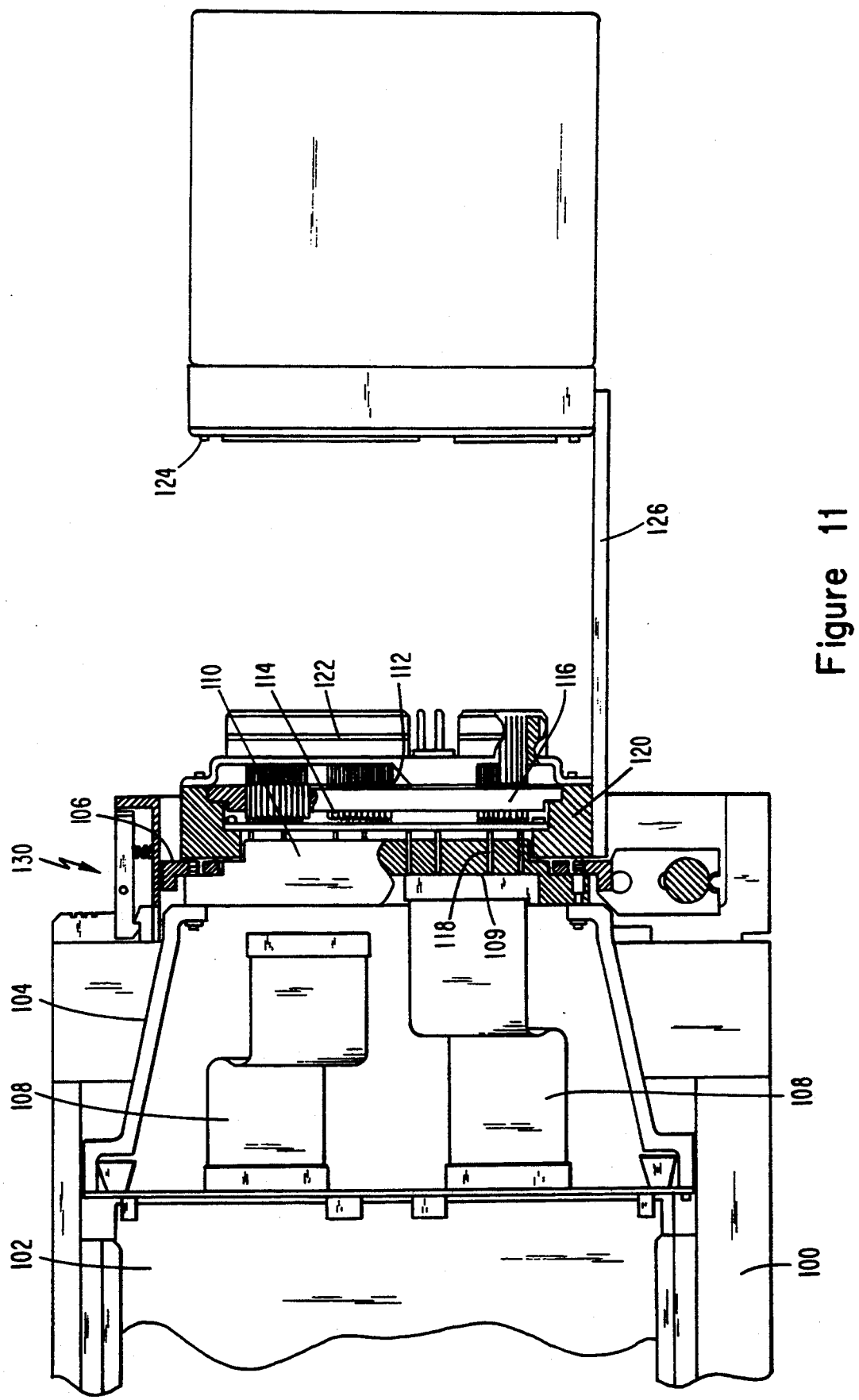
FIG. 11 is a partial sectional side view of a Twin Access Connector (TAC) module including an array of double-headed twist probes providing electrical connectivity between components of a test device.

Another embodiment of the invention is shown in FIG. 11 wherein a plurality of twist probes are configured in an array to form a Twin Access Connector (TACC) module for interfacing test components with a personality board. A testing device 100 includes a plurality of test cards 102 housed in a card cage. Each test card 102 has attached, to a front plate thereof, an interconnect adaptor 104. The details of the interconnect adaptor can be found in allowed U.S. patent application, Ser. No. 07/585,800, filed Sep. 21, 1990, incorporated herein by reference. A rear TAC module 110 is attached to the front of interconnect adaptor 104, the combination being located by receiver frame 106. TAC module 110 includes a plurality of twist probes 118 providing electrical contact between terminal ends 109 of cables 108 and a personality board 114. An opposite face of personality board 114 engages twist probe connectors 112 of front TAC module 116 to provide electrical conductivity to connector 122. Device Under Test (DUT) 124 includes corresponding connectors to engage connector 122 and is supported by support plate 126.

The TAC modules shown in FIG. 11 permit rapid removal and replacement of personality board 114 to adapt testing equipment 110 to various DUTs 124. In particular, to change a personality board, receiver 130 is disengaged, thereby releasing the ITA 120 which contains front TAC module 116 and personality board 114. Upon minor disassembly of ITA 120 the personality board 114 can then be removed and replaced by a new personality board and ITA 120 can be reassembled. Upon engaging receiver 130, TAC module 116 is brought back into engagement with personality board 114. Because twist probes 118 rotate upon depression, oxide on connector pads and components of personality board 114 is removed, thereby creating a low resistance connection.

Figure 12:
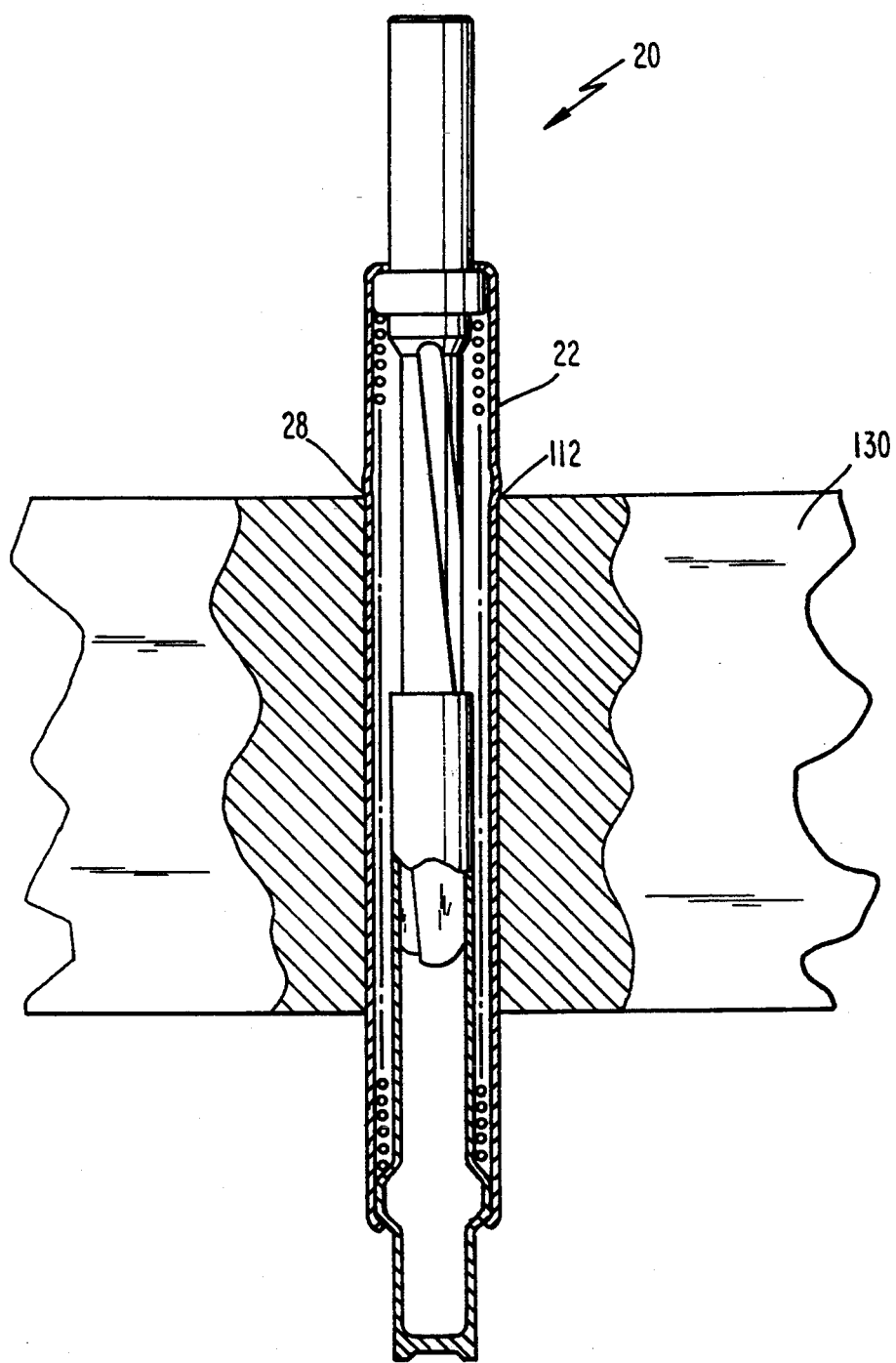
FIG. 12 is a partial sectional view of double-headed twist probe mounted in a module.

Mounting of a double-headed twist probe 20 in a TAC module 110 is shown in greater detail in FIG. 12. Housing 22 is inserted into an aperture 112 in frame 130 of module 110 until press ring 28 engages a front surface of the frame. Probe 20 is deformably retained in the aperture as shown. The frame may comprise an insulating substrate such as plastic with an array of through holes for receiving probes 20. Peripheral portions of frame 130 include mounting structures for securing the frame to the front of a card cage.

Figure 13:
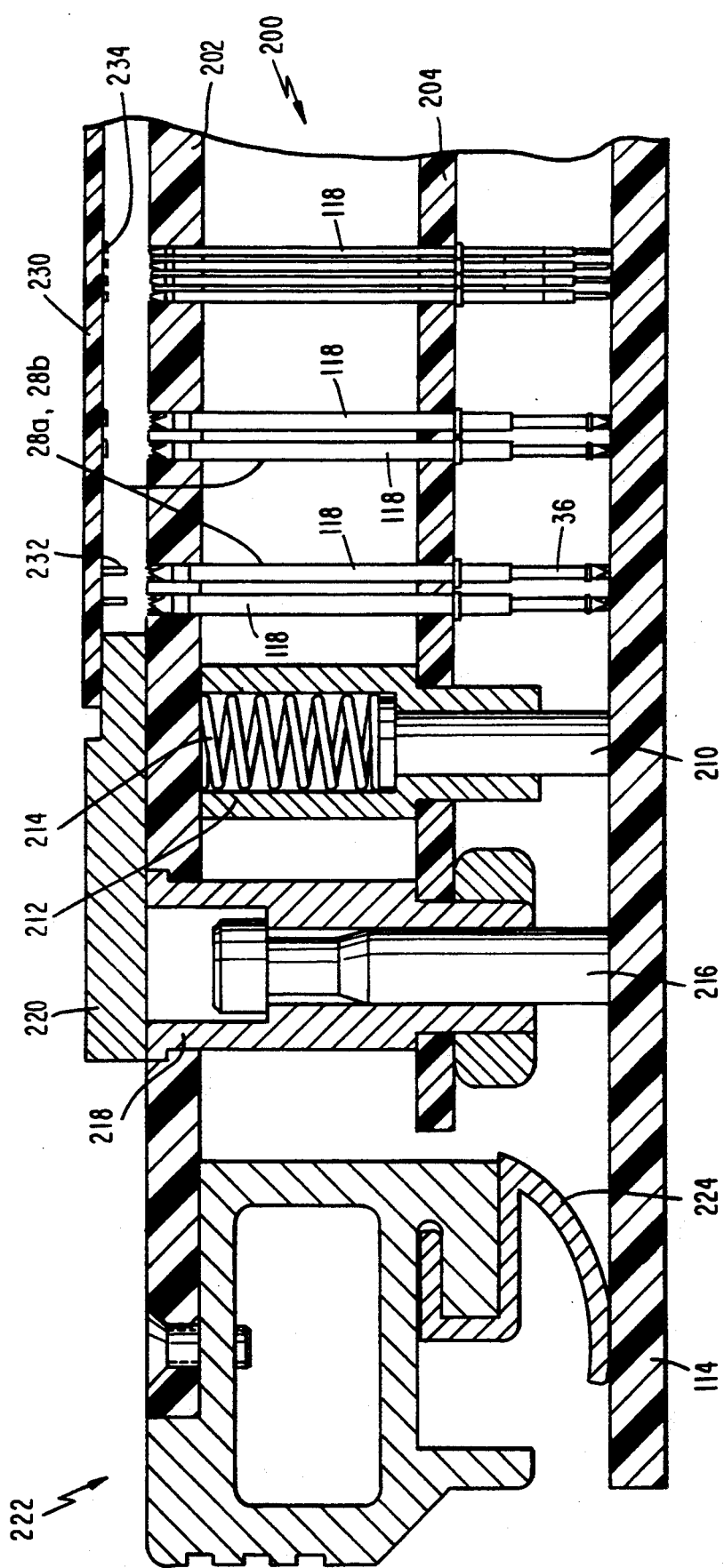
FIG. 13 is a partial sectional view of wireless fixture for interfacing a personality board to a printed circuit board under test.
Figure 14:
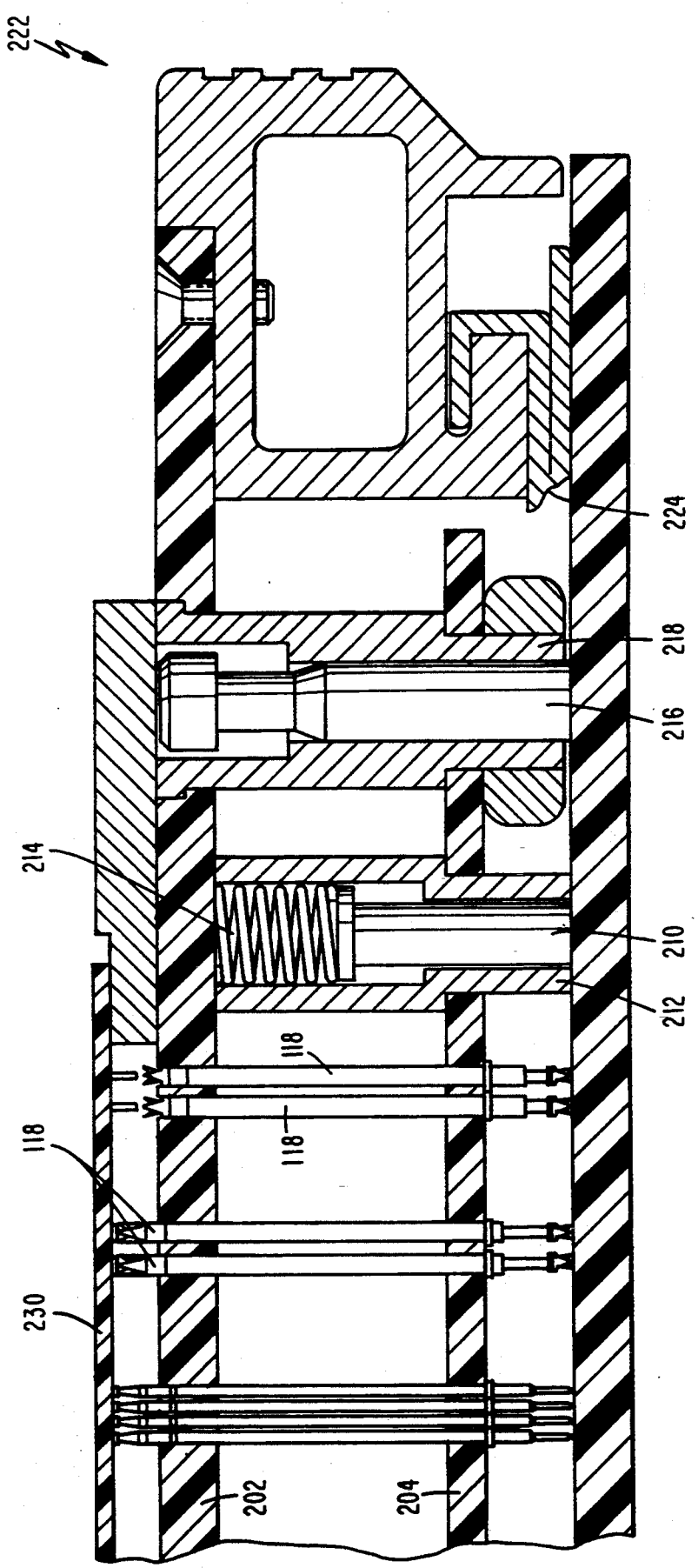
FIG. 14 is a partial sectional view of the wireless fixture shown in FIG. 13 with the printed circuit board positioned to engage the twist probes.

Another embodiment of the invention illustrated in FIGS. 13 and 14 incorporates a plurality of double-headed probes to directly interface a personality board to a circuit board under test. The probes may be double-headed helix twist probes. Referring to FIG. 13, an interface fixture 200 includes parallel top plate 202 and alignment plate 204. Plates 202 and 204 are made of a suitable electrical insulating material such as plastic with a plurality of aligned through holes. Probes 118 are positioned between the boards with opposite ends of the probes extending through respective vertically aligned through holes of plates 202 and 204. The through holes have diameters greater than a housing diameter of probes 118 positioned therein but less than the diameter of retaining rings 28a and 28b formed proximate opposite ends of the housings. Upward axial translation of probes 118 through the through holes is constrained by engagement of upper retaining ring 28a by surrounding portions of top plate 202 and downward translation is limited by lower retaining ring 28b engaging surrounding portions of alignment plate 204.

Fixture 200 is positioned above a personality board 114 so that lower external probe portions 36 of probes 118 engage contact pads formed on an upper surface of the personality board. Spring plungers 210 extend upward from personality board 114 and are retained within spring housings 212 provided at peripheral portions of the fixture. Return compression springs 214 are seated atop spring plungers 210 with opposite ends of the springs engaging top plate 202 to bias top plate 202 and alignment plate 204 upward. Upward travel of top plate 202 is limited by engagement of the head portions of spring plungers 210 with lower necked portions of spring housings 212.

Guide pins 216 and guide bushings 218 maintain alignment between the personality board 114, fixture 200 and a printed circuit board 230 of a unit under test (UUT). The guide pins 216 are positioned at peripheral portions of personality board 114 to engage corresponding guide bushings extending through top plate 202 and alignment plate 204 to engage UUT gasket 220. Peripheral portions of printed circuit board 230 rest on UUT gasket 220 to position the printed circuit board parallel to and above top plate 202.

A frame member 222 is positioned atop personality board 114 with fixture 200 and printed circuit board 230 located within the frame opening. A lower surface of frame member 222 includes a fixture gasket 224 made of a resilient material. The gasket provides a compressible air seal between frame member 222 and underlying personality board 114. An upper surface of frame member 222 includes a flange on which UUT gasket 220 is seated.

The combination of personality board 114, frame member 222, fixture 200 and printed circuit board 230 form a closed chamber. When the chamber is subjected to atmospheric pressure as shown in FIG. 13 frame member 222, fixture 200 and printed circuit board 230 resting thereon are biased upward, away from personality board 114 by return spring 114. In this "free state", component leads 232 and printed circuit pads 234 located on the lower surface of printed circuit board 230 are spaced above personality board 114 whereby the upper contact terminals of twist probes 118 are spaced apart from printed circuit board 230. Upon application of a vacuum source to the chamber, printed circuit board 230 is drawn down under atmospheric pressure into engagement with twist probes 118 as shown in FIG. 14. Alternate mechanical activation of the fixture is possible.

In summary, the double-headed twist probe according to the invention provides direct electrical conductivity between circuitry mounted on parallel substrates, avoiding intermediate connectors and wiring. By mounting a plurality of double-headed twist probes in a suitable supporting member, a double-sided "bed of nails" configuration is achieved to form a TAC module. The TAC module accommodates simplified removal and replacement of frequently changed circuit board mounted components, such as testing equipment personality boards.

Although the present invention has been described and illustrated in detail, it is clearly understood that the same is by way of illustration and example only and is not to be taken by way of limitation, the spirit and scope of the present invention being limited only by the terms of the appended claims.

While there have been described and illustrated several specific embodiments of the invention, it will be clear that variations in the details of the embodiments specifically illustrated and described may be made without departing from the true spirit and scope of the invention as defined in the appended claims.

We claim:

1. An electrical probe comprising:
   a housing having first and second opposite open ends;
   a first elongated plunger partially positioned within said housing said plunger rotatable about and slidable along its longitudinal axis, within said housing and having
   (i) a first portion extending out of said housing through said first opening end and terminating in a first electrical contact probe and
   (ii) a rod-like second portion lengthwise contiguous with said first portion positioned within said housing, said second portion having a bearing surface for transmitting a torque;
   a second elongated plunger partially positioned within said housing, said second plunger rotatable about, and slidable along, its axis, within said housing, and having
   (i) a first portion extending out from said housing through said second open end and terminating in a second electrical contact probe head and
   (ii) a tubular second portion lengthwise contiguous with said first portion, positioned within said housing, said second portion of said first elongated plunger positioned within the second portion of said second elongated plunger, said second portion of said second elongated plunger having an aperture for engaging said bearing surface of said first elongated plunger; and
   a compression spring positioned within said housing and engaging and axially biasing said first and second elongated plungers outward from said housing wherein said first and second opposite ends of said housing having restricted apertures for limiting axial travel of said first and second elongated plungers outwardly from said housing;
   said aperture including a keyway and second portion of said first elongated plunger comprises a cylindrical solid member having a helical channel forming said bearing surface for engaging said keyway, said keyway being formed at an obtuse angle to the longitudinal axis thereof to engage said channel during relative rotational movement of said plungers.

2. The probe of claim 1 wherein said keyway is disposed at an angle of about 174° to the longitudinal axis of said plunger.

3. The probe assembly according to claim 2 wherein said helical channel subtends a radial angle of between 90° and 150° over said length of said second portion of said elongated plunger.

4. The probe assembly according to claim 3 wherein said channel subtends a radial angle of approximately 120° over said length of said second portion of said first elongated plunger.

5. The electrical probe assembly of claim 2 further comprising a second helical channel formed opposite said first helical channel in said cylindrical solid member and a second keyway formed in said aperture of said second plunger, said keyways respectively engaging the bearing surfaces of said channels.

6. The electrical probe assembly of claim 2 further comprising an elongated leafspring formed in the tubular second portion of said second plunger adjacent the aperture for engaging the rod-like second portion of said first elongated plunger against lateral movement during rotational slidable movement along the axis thereof.

7. The electrical probe assembly of claim 1 wherein the portion of said second elongated plunger positioned outside said housing and terminating in an electrical contact probe head further comprises a plurality of inwardly directed leaves extending therewithin for engaging a contact probe head inserted therewithin.

8. An elongated electrical probe assembly comprising:
   a housing having an elongate tubular outer wall surrounding a hollow interior space;
   a first plunger disposed in said barrel and rotatable about, and slidable along, its axis, within said barrel, and having an outer portion extending through an open end of the barrel and terminating in a contact tip outside the barrel, said first plunger including a cylindrical rod portion disposed within said interior of said barrel, said rod portion having an elongated control surface of helical configuration with an axial pitch and polygon-shaped cross section;
   a second plunger disposed in said barrel and rotatable about, and slidable along, its axis, within said barrel, and having an outer portion extending through an opposite open end of the barrel and terminating in a contact tip outside the barrel, said second plunger including a hollow tubular portion disposed within said interior of said barrel, said hollow tubular portion having a polygon-shaped pilot hole through which said cylindrical rod portion of said first plunger passes whereby said pilot hole engages said engaging said control surface of said rod portion; and
   a spring disposed in the barrel and biased against the first and second plungers so that axial travel of the plungers into the barrel is against the bias of the spring,
   wherein said first one of said plungers includes a portion which comprises a cylindrical solid member having a helical channel forming a bearing surface for engaging said keyway, said keyway being formed at an obtuse angle to the longitudinal axis thereof to engage said helical channel during relative rotational movement of said plungers.

9. A double-headed spring contact probe for loaded board testing, comprising:
   a barrel having a hollow interior;
   a pair of opposite plungers positioned and axially slidable and rotatable in said barrel, said plungers having outer portions extending through respective opposite open ends of the barrel, each plunger terminating in a contact tip outside the barrel, a first one of said plungers having a hollow receptacle extending into the barrel with a rectangular keyway opening into the receptacle, the other plunger having a twisted guide member extending through the barrel into the keyway of the other plunger whereby axial translation of the plungers relative to each other causes a rotation thereof; and a spring engaging opposite collar portions of the plungers, biasing the plungers outwardly against opposite ends of the barrel, said barrel including necked portions limiting travel of the plungers out from the barrel, wherein said first one of said plungers includes a portion which comprises a cylindrical solid member having a helical channel forming a bearing surface for engaging said keyway, said keyway being formed at an obtuse angle to the longitudinal axis thereof to engage said helical channel during relative rotational movement of said plungers.

* * * * *